(12) United States Patent
Vasic et al.

(10) Patent No.: US 6,909,385 B2
(45) Date of Patent: Jun. 21, 2005

(54) METHOD AND APPARATUS FOR SUPPRESSING LOW FREQUENCY CONTENT IN DIGITAL DATA

(75) Inventors: Bane Vasic, Tucson, AZ (US); Erozan M. Kurtas, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 522 days.

(21) Appl. No.: 10/084,040

(22) Filed: Feb. 27, 2002

(65) Prior Publication Data

US 2003/0011919 A1 Jan. 16, 2003

Related U.S. Application Data

(60) Provisional application No. 60/303,831, filed on Jul. 9, 2001.

(51) Int. Cl.[7] .............................................. H03M 7/20
(52) U.S. Cl. ......................... 341/102; 341/58; 341/103
(58) Field of Search .......................... 341/102, 58, 103

(56) References Cited

U.S. PATENT DOCUMENTS

| | | | |
|---|---|---|---|
| 4,309,694 A | | 1/1982 | Henry .......................... 340/347 |
| 4,486,739 A | | 12/1984 | Franaszek et al. .......... 340/347 |
| 4,603,413 A | | 7/1986 | Sinjou et al. ................. 369/59 |
| 5,073,776 A | | 12/1991 | Shigemori ................... 341/106 |
| 5,396,239 A | * | 3/1995 | McMahon et al. ............ 341/58 |
| 5,450,443 A | | 9/1995 | Siegel et al. ................ 375/286 |
| 5,497,384 A | | 3/1996 | Fredrickson et al. .......... 371/43 |
| 5,537,424 A | | 7/1996 | Karabed et al. .............. 371/43 |
| 5,608,397 A | * | 3/1997 | Soljanin ....................... 341/58 |
| 5,731,768 A | | 3/1998 | Tsang ........................... 341/59 |
| 5,790,571 A | | 8/1998 | Varanasi .................. 371/40.12 |
| 5,801,649 A | | 9/1998 | Fredrickson ................. 341/58 |
| 6,052,072 A | | 4/2000 | Tsang et al. .................. 341/59 |
| 6,084,535 A | * | 7/2000 | Karabed et al. .............. 341/58 |
| 6,111,834 A | | 8/2000 | Rub et al. ...................... 369/59 |
| 6,198,582 B1 | | 3/2001 | Tsang et al. .................. 360/40 |
| 6,233,289 B1 | | 5/2001 | Fredrickson ................. 375/341 |
| 6,288,655 B1 | | 9/2001 | Tsang et al. .................. 341/59 |

FOREIGN PATENT DOCUMENTS

| | | |
|---|---|---|
| EP | 0 367 093 | 5/1995 |
| JP | 03242026 | 10/1991 |
| WO | WO 97/13347 | 4/1997 |

OTHER PUBLICATIONS

D.E. Knuth, "Efficient Balanced Codes," IEEE Transactions on Information Theory, vol. IT–32, No. 1, pp. 51–53, Jan. 1986.

N. Alon, E.E. Bergmann, D. Coppersmith, and A.M. Odlyzko, "Balancing Sets of Vectors," IEEE Transactions on Information Theory, vol. 34, No. 1, pp. 128–130, Jan. 1988.

I.J. Fair, W.D. Gover, W.A. Krzymien, and R.I. MacDonald, "Guided Scrambling: A New Line Coding Technique for High Bit Rate Fiber Optic Transmission Systems," IEEE Transactions on Communications, vol. 39, No. 2, pp. 289–297, Feb. 1991.

(Continued)

*Primary Examiner*—Michael Tokar
*Assistant Examiner*—Lam T. Mai
(74) *Attorney, Agent, or Firm*—Westman, Champlin & Kelly, P.A.

(57) ABSTRACT

A method of encoding digital information in order to suppress dc includes the steps of receiving a sequence of m message bits of a message word, and mapping the sequence of m message bits of the message word to a codeword, of length n bits, generated from the m message bits using algebraic operations. Multiple codeword candidates are generated from the m message bits using the algebraic operations to combine the m message bits with different periodic scrambling sequences. One of the codeword candidates is selected for mapping based upon an optimizing criteria. Second order digital sum sequences, corresponding to each of the plurality of codeword candidates, can be used as the optimizing criteria to select the codeword.

16 Claims, 8 Drawing Sheets

OTHER PUBLICATIONS

K.A.S. Immink and L. Patrovics, "Performance Assessment of DC–Free Multimode Codes," IEEE Transactions on Communications, vol. 45, No. 3, pp. 293–299, Mar. 1997.

W. G. Bliss, "Circuitry For Performing Error Correction Calculations on Baseband Encoded Data to Eliminate Error Propagation," IBM Technical Disclosure Bulletin, vol. 23, No. 10, pp. 4633–4634, Mar. 1981.

J.L. Fan and A.R. Calderbank, "A Modified Concatenated Coding Scheme, with Applications to Magnetic Data Storage," IEEE Transactions on Information Theory, vol. 44, No. 4, pp. 1565–1574, Jul. 1998.

A.J. van Wijingaarden and K.A.S. Immink, "Constructions of Constrained Codes Employing Sequence Replacement Techniques," IEEE International Symposium on Information Theory, Jun. 29–Jul. 4, 1997.

G.L. Pierobon, "Codes for Zero Spectral Density at Zero Frequency," IEEE Transactions on Information Theory, vol. IT–30, No. 2, pp. 435–439, Mar. 1984.

E. Elefheriou and R.D. Cideciyan, "On Codes Satisfying Mth–Order Running Digital Sum Constraints," IEEE Transactions on Information Theory, vol. 37, No. 5, pp. 1294–1313, Sep. 1991.

K.A.S. Immink, "Construction of Binary DC–Constrained Codes," Philips Journal of Research, vol. 40, No. 1, pp. 22–39, 1985.

K.A.S. Immink, "Spectrum Shaping with Binary $DC^2$–Constrained Channel Codes," Philips Journal of Research, vol. 40, No. 1, pp. 40–53, 1985.

K.A.S. Immink, "Spectral Null Codes," IEEE Transactions on Magnetics, vol. 26, No. 2, pp. 1130–1135, Mar. 1990.

V. Braun and A.J.E.M. Janssen, "On the Low–Frequency Suppression Performance of DC–Free Runlength–Limited Modulation Codes," IEEE Transactions on Consumer Electronics, vol. 42, No. 4, pp. 939–945, Nov. 1996.

\* cited by examiner

METHOD AND APPARATUS FOR SUPPRESSING LOW FREQUENCY CONTENT IN DIGITAL DATA

CROSS-REFERENCE TO RELATED APPLICATION

This application claims priority from U.S. Provisional Application No. 60/303,831, filed Jul. 9, 2001, and entitled "METHOD AND APPARATUS FOR SUPPRESSING LOW FREQUENCY CONTENT IN DIGITAL DATA".

FIELD OF THE INVENTION

The present invention relates generally to the field of coding for digital systems. More particularly, but not by limitation, the present invention relates to improved methods and apparatus for high rate encoding and efficient decoding of digital data in such a way that coded data are dc-free and suitable for recording information on a recording medium, and reading back the data from a recording medium, such as magnetic disc.

BACKGROUND OF THE INVENTION

Recording medium for recording data include magnetic discs, optical discs, magneto-optical discs, and magnetic tapes, for example. When data is digitally recorded on, or read back from, a recording medium, it is preferable that the data is recorded at a high density. Partial response systems are usually used for this purpose. High-density recording is then possible by adopting a PRML (Partial Response with Maximum Likelihood) method that combines the partial response equalization and Viterbi detection.

During readback it is desirable that the signal does not have a dc (direct current) component, or at least that the dc component is as small as possible. This means that the power spectral density function of the recorded sequence at dc equals zero. Such sequences are said to be dc-free. It is desirable that the sequence be as dc-free as possible because it is necessary to ensure that, for example, errors due to variations in a reference level during quantization of the read back signal do not occur. It is also desirable that the sequence be substantially dc-free to ensure that fluctuations do not occur in error signals, such as tracking error signals, occurring in the servo control.

With the recorded symbols taken to be +1 and −1, so that +1 corresponds to binary 1 and −1 corresponds to binary 0, the so-called running digital sum (RDS) is a standard measure for evaluating the dc component. The RDS is the total sum of the recorded symbols from the time of starting the sequence. A small RDS absolute value, namely low disparity between +1s and −1s, means that the content of the dc component is low. Sequences with equal numbers of +1s and −1s are referred to as being "balanced." Balanced sequences do not have a dc component. Further measures of suppression of low frequencies of a signal are so called "RDS of higher order." The higher order RDS can be computed recursively in such a way that the RDS of the order i is an algebraic sum of values of an RDS of lower order, i−1.

Partial response systems, or system with a controlled inter-symbol interference, are commonly described by so-called "target partial response polynomials" having the form $h(D)=h_0+h_1 D+h_2 D^2+ \ldots +h_1 D^1$, where D is a time delay operator. The values of the polynomial coefficients $h_1, h_2, \ldots, h_1$ represent values of a sampled channel response to an isolated impulse. The typical form of a partial response polynomial used in magnetic disc devices exploiting longitudinal recording is $h(D)=(1-D)^m(1+D)^n$ where m and n are positive integers. In optical recording systems and in perpendicular magnetic recording systems the typical form of a partial response polynomial is $h(D)=(1+D)^m$. If the partial response polynomial contains a term (1−D), then the frequency response of such a channel does not pass a dc component, and RDS control to make the maximum absolute value of the RDS of the modulation code sequence small is therefore not needed. However, for partial response polynomials that do not have factor (1−D), the frequency response of a channel does have a dc component and RDS control does have to be carried out.

Modulation coding can be used to obtain dc-free sequences. Modulation coding may be implemented, for example, by parsing digital information that is to be recorded into strings of bits, called message words. Each message word is then used to select a codeword from a codebook. The codewords in the codebook are of length n bits, where the codeword bits define a recorded sequence. In other words, the codeword bits define a sequence of symbols to be recorded on a medium. However, efficient or high-rate dc-free modulation codes that can ensure bounded value of RDS, without adding an excessive number of redundant bits to the information to be recorded, typically require both codewords and codebooks of larger sizes as discussed further below.

The measure of code efficiency is a parameter called "code rate," which represents the ratio between m, the message word length and n, the codeword length. Furthermore, in recording systems, it is desirable that a modulation code have a rate higher than 8/9, so that more information can be written on the recording medium. Codes having a relatively long codeword length are required for rates above 8/9. Also, large codebooks are required where the codewords in the codebooks are dc-free. For example, a code of rate 16/17 requires a codeword length of 17 and a codebook size of 65536. Such large codebooks, however, typically require the implementation of complex circuitry and require relatively high power consumption and a large area on integrated circuits. Also, the larger the codebook, the more time it takes to access codewords in the codebook. With current technology, it would be extremely costly, if even possible, to design a codebook with 65536 words of length 17. Thus, there is a need for a method and apparatus for generating high rate codes that are dc-free and lend themselves to a low complexity implementation.

Typically, an error correcting code is used in conjunction with a modulation code. Error correcting codes introduce additional bits to a signal to form an encoded signal. The additional bits improve the ability of a system to recover the signal when the encoded signal has been corrupted by noise introduced by a recording channel.

Examples of a modulation codes are the 8–10 code adopted in digital audio tape recorders (DAT), the EFM (Eighteen to Fourteen Modulation) code adopted in compact disc (CD) players, and the EFMPlus code adopted in digital versatile disc (DVD) players. Various codes for eliminating dc free components are known. Examples of error correcting codes include Reed-Solomon codes adopted in magnetic and optical recording systems.

Typically, data is first encoded using an error correcting code, and then using a modulation code. This is called a traditional error-correcting-modulation coding concatenation scheme. When a traditional error correcting-modulation coding concatenation scheme is used together with high rate dc-free codes, the error multiplication is inevitable. Error multiplication means that error in one recorded bit produces errors on several bits in the decoded data. This effect is a consequence of the nonlinear structure of a modulation decoder. Another scheme, so called inverse concatenation, puts modulation encoding before error control coding, and modulation decoding after modulation decoding. In this way, the errors are first corrected by an error correcting code, and the error multiplication is prevented. However, the error correcting encoder does not necessarily produce balanced codewords nor low disparity codewords, hence undoing the disparity control introduced by the modulation encoder. Therefore, there is a need for a method and apparatus for generating high rate codes that are at the same time dc-free and possess error control capabilities.

SUMMARY OF THE INVENTION

Embodiments of the present invention relate to methods and apparatus for high rate encoding and efficient decoding of digital data. The methods provide coded data which are substantially dc-free and suitable for recording information on a recording medium, and reading back the data from a recording medium. The apparatus include data storage devices and systems which implement the method.

The present invention addresses the aforementioned problems by providing a method and apparatus for encoding digital information to be recorded on a recording medium. The method includes the steps of receiving a sequence of m message bits, and mapping the sequence of m message bits to a list of not more than K codewords of length n. The method preferably includes selecting one codeword from a list of K codewords and recording it on a recording medium. As opposed to previous art, the method does not require using codebooks. The codeword is obtained solely by using algebraic operations such as addition and comparison.

In one particular embodiment, the method includes adding a set of four periodic sequences to a message word, thus creating a set of four codeword candidates. For each codeword candidate an RDS sum is calculated and a set of a positions within the codeword is determined, such that, inverting bits in the codeword candidate starting at a position from the set of determined positions results in an RDS at the end of the codeword being equal to zero. Then, for each of four candidates and for each respective position in the corresponding set of positions, the second order digital sum sequence is calculated as a cumulative sum of RDS values from the beginning of the encoding process, and a sequence which produces a smallest absolute value of a second order RDS is selected together with a periodic sequence added to it, and a position where the inversion of bits has started. Although sets of four codeword candidates are described herein, more or fewer codeword candidates can also be used.

In some embodiments, the position from where the inversion of bits has started is first encoded by a classical low disparity code (that use for example codebooks, as explained in previous art), and then appended to the selected codeword. Two bit information, on which periodic sequence has been added to the message word prior to inversion, is also appended to the message word thus forming a modulation codeword. The modulation codeword is then encoded by an error correcting code, for example linear block code, and then recorded to the medium. The parity bits of the error correction code may introduce misbalance in symbols +1 and −1, however when the computation of RDS and second order RDS of the next message word begins, this misbalance is taken into account, and the modulation encoding method compensates for it. Any misbalance in positive and negative bits after adding parity bits in the error correction encoder is compensated for in the next modulation encoding round.

The present invention also provides a method and apparatus for decoding information stored on a recording medium. A more complete understanding of the present invention, as well as other features and advantages of the present invention, may be obtained with reference to the following detailed description and accompanying drawings.

These and various other features as well as advantages which characterize embodiments of the present invention will be apparent upon reading of the following detailed description and review of the associated drawings.

DETAILED DESCRIPTION OF ILLUSTRATIVE EMBODIMENTS

Figure 1:
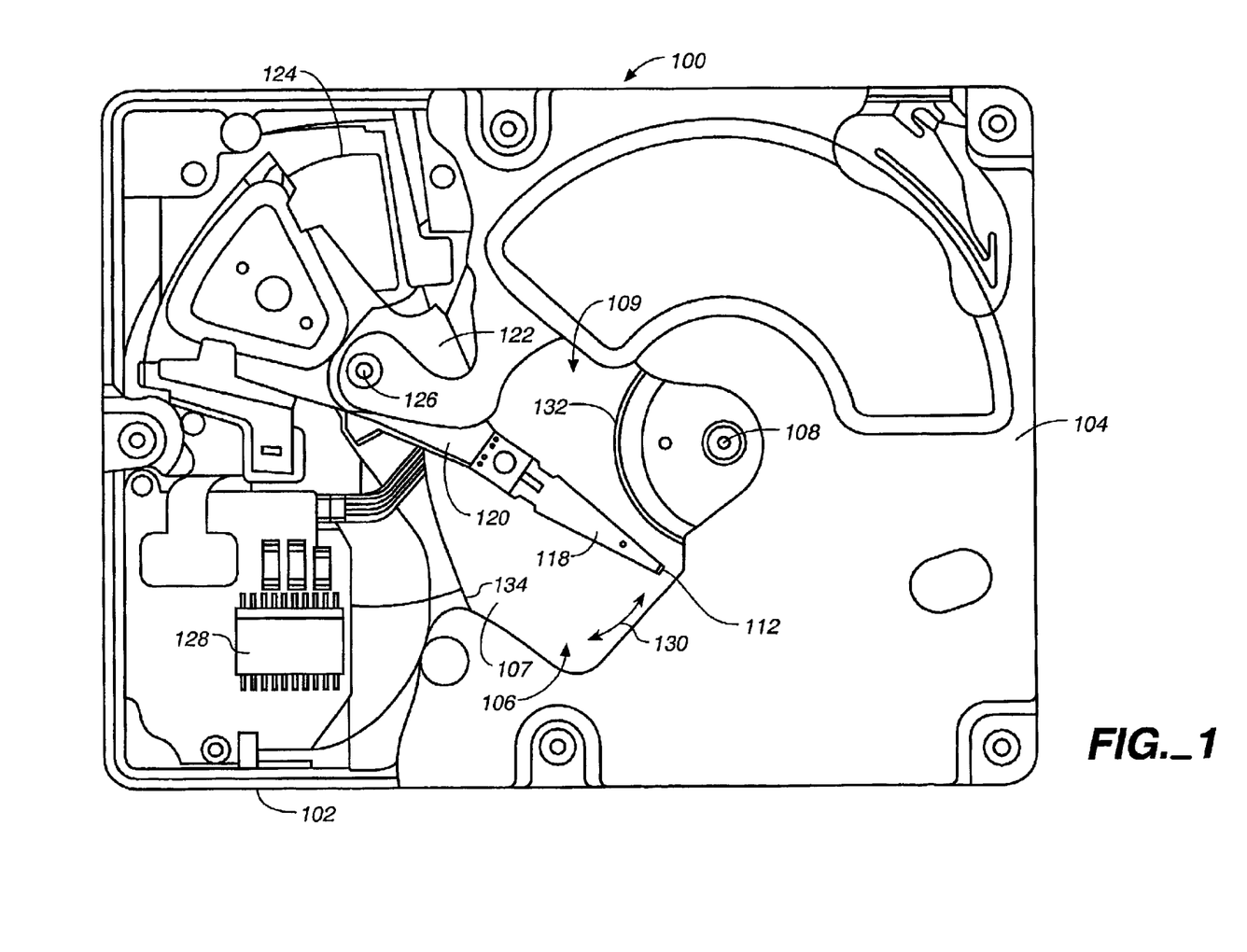
FIG. 1 is a plan view of a disc drive in accordance with embodiments of the present invention.

FIG. 1 is a plan view of a disc drive 100 which includes a housing with a base 102 and a top cover 104 (sections of top cover 104 are removed for clarity). Disc drive 100 further includes a disc pack 106 which is mounted on a spindle motor (not shown). Disc pack 106 includes a plurality of individual discs 107 which are mounted for co-rotation about central axis 108. Each disc 107 has an associated product head 112 which carries one or more read and write transducers (read and write heads) for communicating with disc surface 109. Each product head 112 is supported by a suspension 118 which is in turn attached to a track accessing arm 120 of an actuator assembly 122. Actuator assembly 122 is rotated about a shaft 126 by a voice coil motor 124, which is controlled by servo control circuitry, to move head 112 in an arcuate path 130 between a disc inner diameter 132 and a disc outer diameter 134.

Also shown in FIG. 1 is circuitry 128 which herein diagrammatically represents circuitry associated with the channel architecture used in processing signals to be written to or read from the disc or media surface. The position in which circuitry 128 is located need not be as shown in FIG. 1, but instead, the position of circuitry 128 shown in FIG. 1 is provided as an example for discussion purposes. Further, disc drive 100 is intended to represent any of a variety of data storage devices in which the methods and apparatus of the present invention can be implemented. For example, in one embodiment, disc drive 100 is a magnetic disc drive utilizing perpendicular recording techniques and components. However, in other embodiments, disc drive 100 can be other types of magnetic disc drive, or can be other types of disc drive such as an optical disc drive, a magneto-optical disc drive, etc. The methods and apparatus disclosed herein can also be used in other data storage devices, for example in magnetic tape storage devices.

Figure 2:
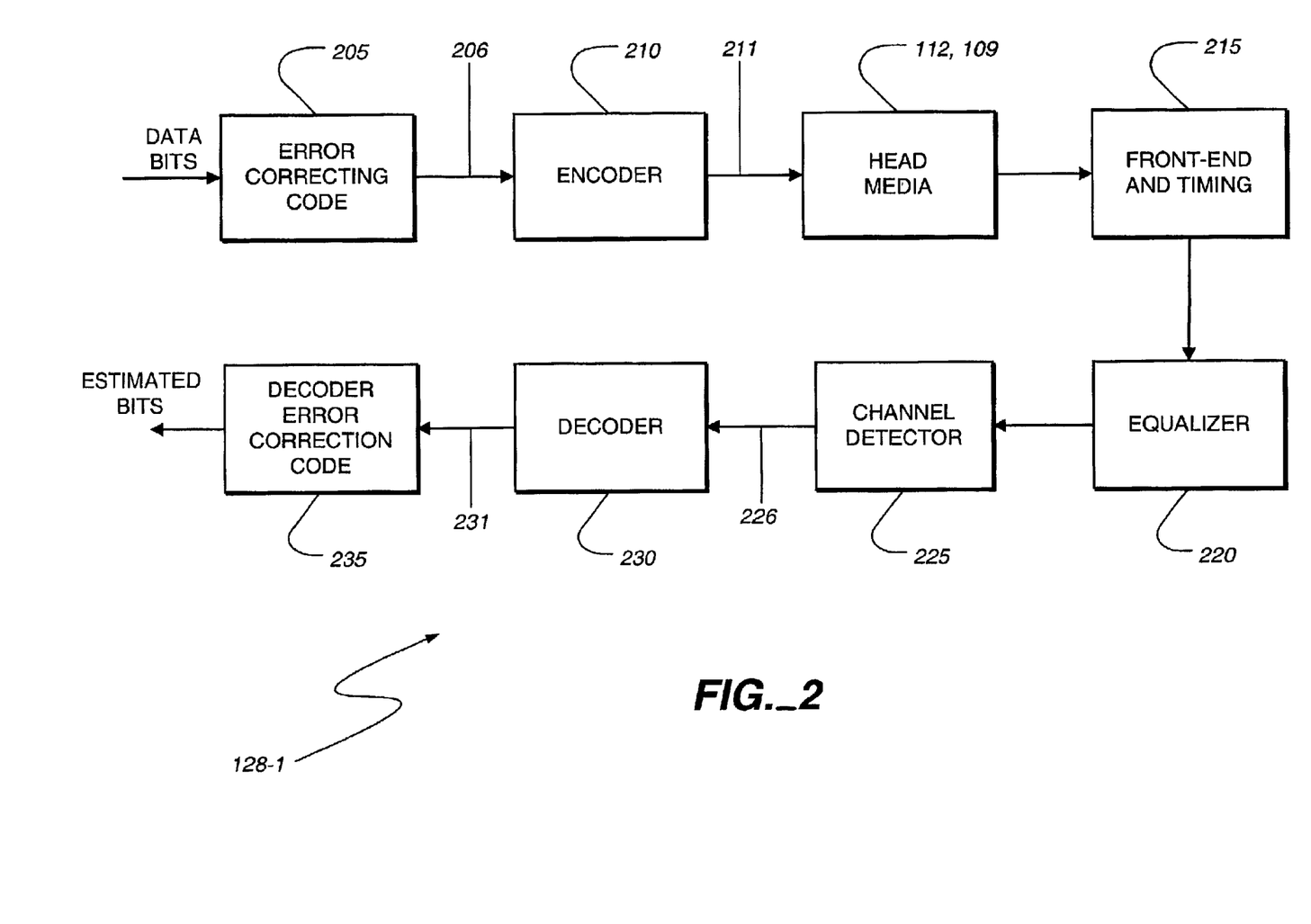
FIGS. 2 and 3 are block diagrams illustrating first and second read channel architectures in which the methods of the invention can be implemented.
Figure 3:
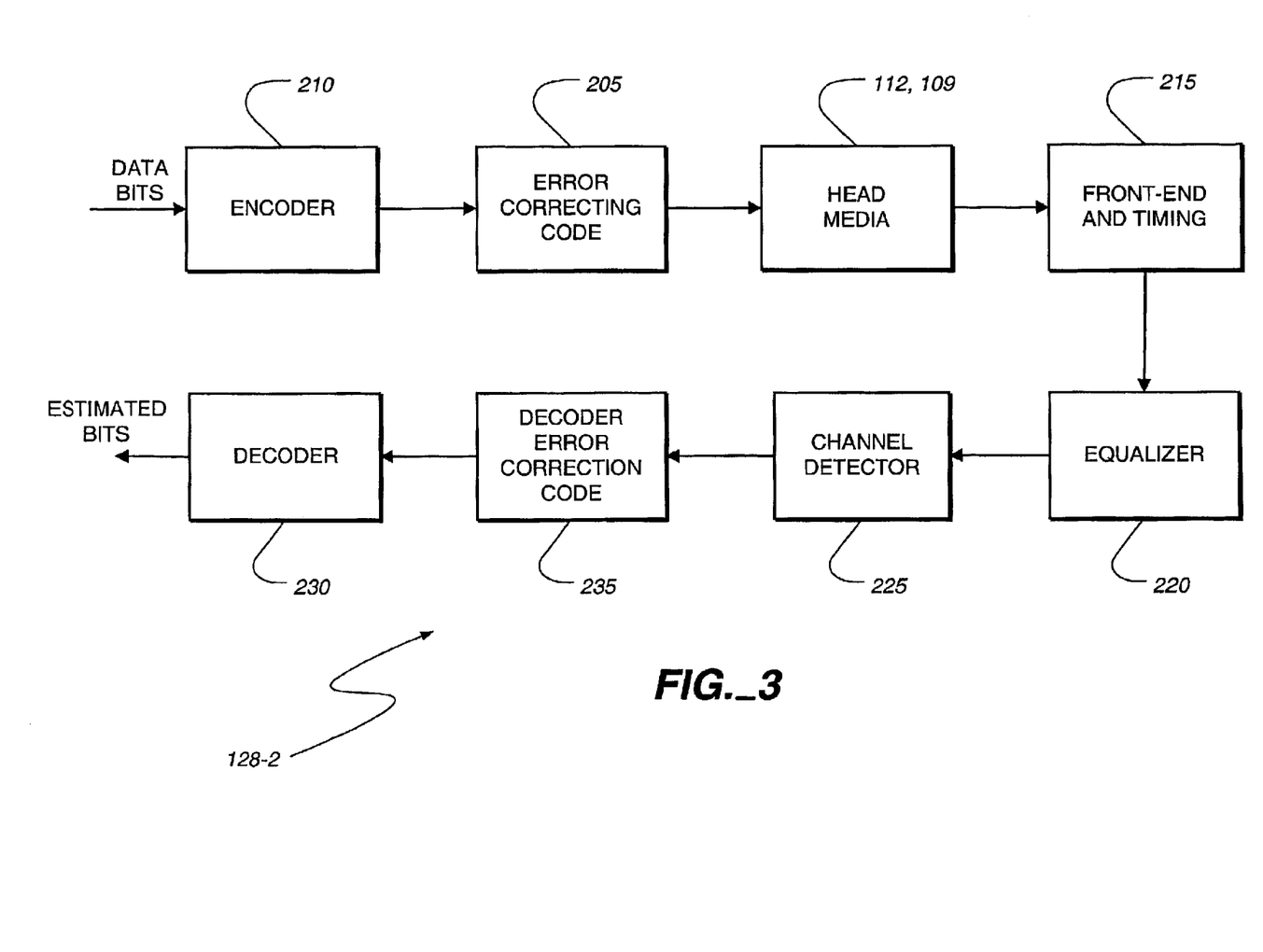

FIGS. 2 and 3 illustrate first and second channel architectures 128-1 and 128-2 in which the encoding and decoding methods of the present invention can be implemented. The various circuits shown in the blocks of FIGS. 2 and 3 can be implemented as integrated circuits, discrete components, or suitably programmed processing circuitry. For discussion purposes, various blocks shown in FIGS. 2 and 3 are referred to generically as being circuitry.

As shown in FIG. 2, data bits of a message word to be recorded on the recording media 109 are provided to error correcting code circuitry 205. Error correcting code (ECC) circuitry introduces additional bits to the message data bits to form an encoded signal 206. The additional bits improve the ability of the system to recover the signal when the encoded signal has been corrupted by noise introduced by the recording channel.

Encoder circuitry 210 receives the ECC encoded signal 206 and implements modulation coding, in accordance with the invention, to obtain dc-free sequences. As will be discussed below in greater detail, encoder circuitry 210 uses methods which allow for the generation of high rate codes that are at the same time dc-free and possess error control capabilities. The generated codewords (represented in FIG. 1 as signal 211) are indicative of the original data bits of the message words provided to the channel. Using head-media interaction of the type which is well known in the art, the high rate and dc-free codewords generated by encoder circuitry 210 can be recorded on the media.

The head-media interaction can also be used to read, at a later time, the codewords recorded on the media in order to retrieve the content of the message words. Front-end timing functions or circuitry 215, equalizer functions or circuitry 220, and channel detector 225 are used, in a conventional manner, to generate a readback signal 226 which is provided to decoder circuitry 230. Decoder circuitry 230 implements decoding methods of the present invention to generate a signal 231 which is still ECC encoded. Then, ECC decoder circuitry 235 provides ECC decoding of the signal 231 to produce estimated bits which should correspond closely to the data bits of the original message word. FIG. 3 illustrates the same circuitry as FIG. 2, but shows that the modulation encoding functions of the present invention provided by circuitry 210 can be implemented before the ECC encoding functions if desired. In these embodiments, the ECC decoding functions would likewise be implemented on the readback signal prior to the modulation decoding provided by decoding circuitry 230.

1. Theoretical Basis of the Method

In order to understand the methods of the present invention, an explanation is provided for a method of generating balanced codewords. Given a message word $a=(a^{(k)})_{1\leq k\leq m}$ of length m (with m being an even integer), one can calculate the running digital sum sequence $s_1=(s_1^{(k)})_{1\leq k\leq m}$ as $s_1^{(k)}=s_1^{(k-1)}+a^{(k)}$, assuming $s_1^{(0)}=0$, and can find the smallest index p such that $s_1^{(p)}=s_1^{(m)}/2$. Next, invert the last m−p bits of the message word and encode the position p by a balanced code. The balanced codeword corresponding to p is denoted by $b_p$ and is of length n−m. Then a codeword can be created by appending $b_p$ to the partially inverted input word. The codeword is of the form $c=(a\oplus u_p, b(p))$, where $u_p$ is a discrete unit step vector raising at k=p, i.e. a vector of the form $(0^p, 1^{m-p})$, and $x^y$ is an all x sequence of length y ($x\in\{0,1\}$, $y\geq 0$). Both $a\oplus u_p$ and $b_p$ are balanced and therefore the codeword c is also balanced. The number of balanced codewords of length n−m is $$|B_{n-m}| = \binom{n-m}{\frac{n-m}{2}}$$

which implies the upper bound on the message length: $2^m \leq |B_{n-m}|$. The last inequality requires that the number of balanced codewords must be sufficient to encode all possible positions p.

Figure 4:
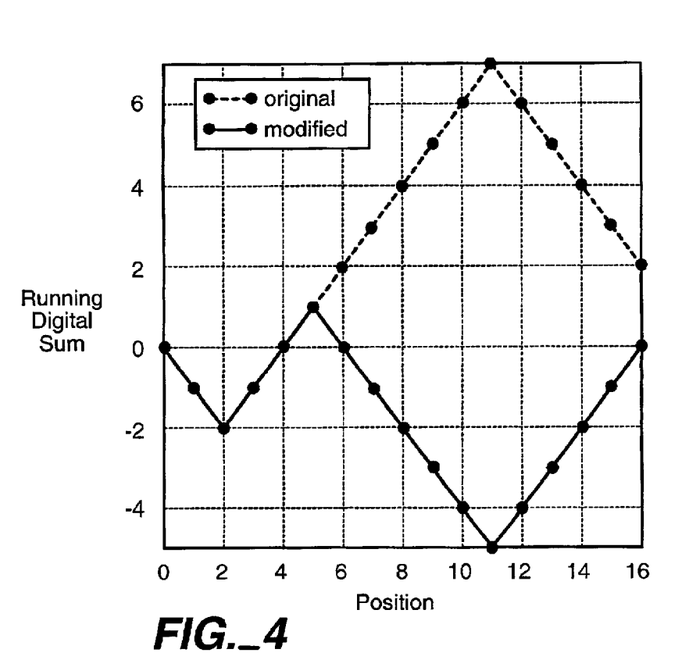
FIGS. 4 and 5 are plots illustrating running digital sums (RDSs) which illustrate aspects of the present invention.

To illustrate this construction, consider a message word $a=(0,0,1,1,1,1,1,1,1,1,1,0,0,0,0,0)$ of length m=16. The running digital sum of this sequence is a dashed curve as shown in FIG. 4. As can be seen, the total message disparity is $s_1^{(16)}=2$, and the position p, such that $s_1^{(p)}=s_1^{(16)}/2=1$, is p=5. The last eleven bits of the message can be inverted to give a modified message of $(0,0,1,1,1,0,0,0,0,0,0,1,1,1,1,1)$. The resulting disparity after inverting the last eleven bits is zero, and the running digital sums of the modified message is shown as a solid curve in FIG. 4.

2. Description of the Method and Apparatus of the Present Invention

In general, there can be more than one position p within a codeword such that $s_1^{(p)}=s_1^{(m)}/2$, and although inverting the last m−p bits produces a balanced codeword, the codewords obtained by inverting bits starting from different positions can differ significantly with respect to their maximal digital sum variations. The method of the present invention takes advantage of this observation. The inventive method or algorithm keeps record of all possible positions and chooses the optimal one. As an optimality criterion (metric), the maximal second or higher order digital sum is used. The description of a second order digital sum is given below.

For a sequence $a=(a^{(k)})_{1\leq k\leq m}$ and a running digital sum vector $s^{(0)}=(s_i^{(0)})_{1\leq i\leq m}$ defining the initial conditions, the running digital sum array of order M is defined as $$S_M(a) = [s_i^{(k)}]_{\substack{0\leq i\leq M \\ 1\leq k\leq m}}$$

where the array entries can be calculated as $$s_i^{(k)}=s_i^{(k-1)}+s_{i-1}^{(k)} \qquad \text{Equation 1}$$

assuming $s_0^{(k)}=2\times a^{(k)}-1$. Consider metrics on an array $S_M(a)$ of the following form $$m_M(a) = \sum_{i=1}^{M} w_i \times \max_k(|s_i^{(k)}|) \qquad \text{Equation 2}$$

where $w_i$ are weight coefficients. Notice the recursive character of calculations in Equation 1. The metric calculation does not require anything more than a simple cumulative adder (see Equation 1) and M comparators (see Equation 2) to keep track of maximal running digital sums of orders 1 to M. A running digital sum of order M=2 gives satisfactory performance. This paragraph above describes a set of modification rules applied to a message sequence a. This set of rules will be referred to hereafter as "modifications of first kind."

Figure 5:
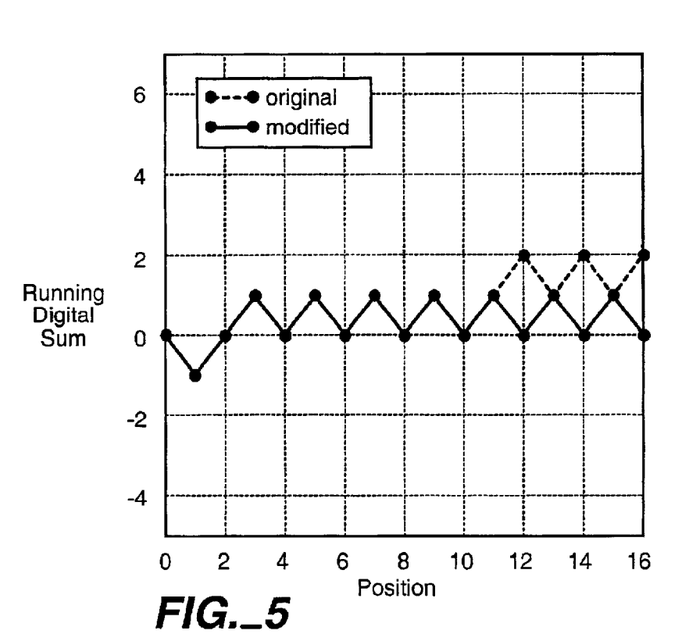

Moreover, looking back to FIG. 4, it can be seen from the solid line that inverting the last portion (i.e., beginning at position 6) of the message word did not break long runs of consecutive like symbols and therefore the maximum values of running digital sums are high regardless of the fact that the codeword is balanced. Consider now a modified sequence obtained by inverting every other message bit to obtain a modified message word of (0,1,1,0,1,0,1,0,1,0,1,1, 0,1,0,1). The corresponding running digital sum is shown in FIG. 5 (dashed). The disparity is $s_1^{(16)}=2$, and the position p such that $s_1^{(p)}=s_1^{(16)}/2=1$ is p=11. The resulting disparity after inverting the last five bits is zero, and the running digital sums of the modified message (i.e., the message word having every other bit inverted, and then having the last 5 bits inverted) is shown as a solid curve in FIG. 5. The long runs are broken and the running digital sum variation is now significantly smaller.

Described now is a second type of modifications, referred to herein as "modifications of a second kind," of a message word. Again assume that "a" is a message word being processed and $s^{(0)}=(s_i^{(0)})_{1 \leq i \leq m}$ is a vector of running digital sums of orders i, $1 \leq i \leq M$ at the end of the previous codeword. Further, let $S=\{s_i:1 \leq i \leq 2^b\}$ be a set of vectors, called "base" or "scrambling" vectors, all of length m. Form a set of codewords $a \oplus s_j$, and for each codeword $a \oplus s_j$ compute a metric array $S_1(a \oplus s_j)$. Then, find a set of all positions p within the codeword $a \oplus s_j$ such that $s_1^{(p)}=s_1^{(m)}/2$. Invert the last m−p bits of codeword $a \oplus s_j$ by adding modulo two the sequence $u_p$ of the form $(0^p,1^{m-p})$, where $x^y$ is the all x sequence of length y, and find the array and the corresponding metric $m_M(a \oplus s_j \oplus u_p)$. All the sequences $(a \oplus s_j \oplus u_p)$ are balanced but have different maximal absolute values of running digital sums. Supposing that combination (j,p) has a minimal metrics, the codeword is created as $(a \oplus s_j \oplus u_p, b_{j,p})$, where $b_{(j,p)}$ is a balanced codeword corresponding to input word (j,p).

An apparatus performing the first and the second types of modifications described above, in accordance with embodiments of the present application, is provided in the following description in conjunction with FIG. 6. To describe the apparatus, consider a code of rate R=256/268, having in mind that codes of different lengths can also be generated by adopting the methods of the present invention. Position $p(1 \leq p \leq m, m=256)$ is encoded by a low disparity block code of rate 8/10, and the last two bits are used to encode one of four Walsh basis vectors used to modify user data. The basis vectors used in this example are: $0^m$, $1^m$, $(10)^{m/2}$ and $(01)^{m/2}$. Note that there are $B_{10}=252$ balanced codewords of length 10, which is not enough to encode m=256 possible inversion positions. Thus, two codewords with disparity −2 and two codewords with disparity +2 are added to the code. The effect of misbalance in the codeword is compensated by the feedback of the algorithm, i.e. by the property of the algorithm that the inverting position is selected on the basis of the running digital sum of the whole sequence, not only on the basis of the current codeword.

Figures 6, 6B:
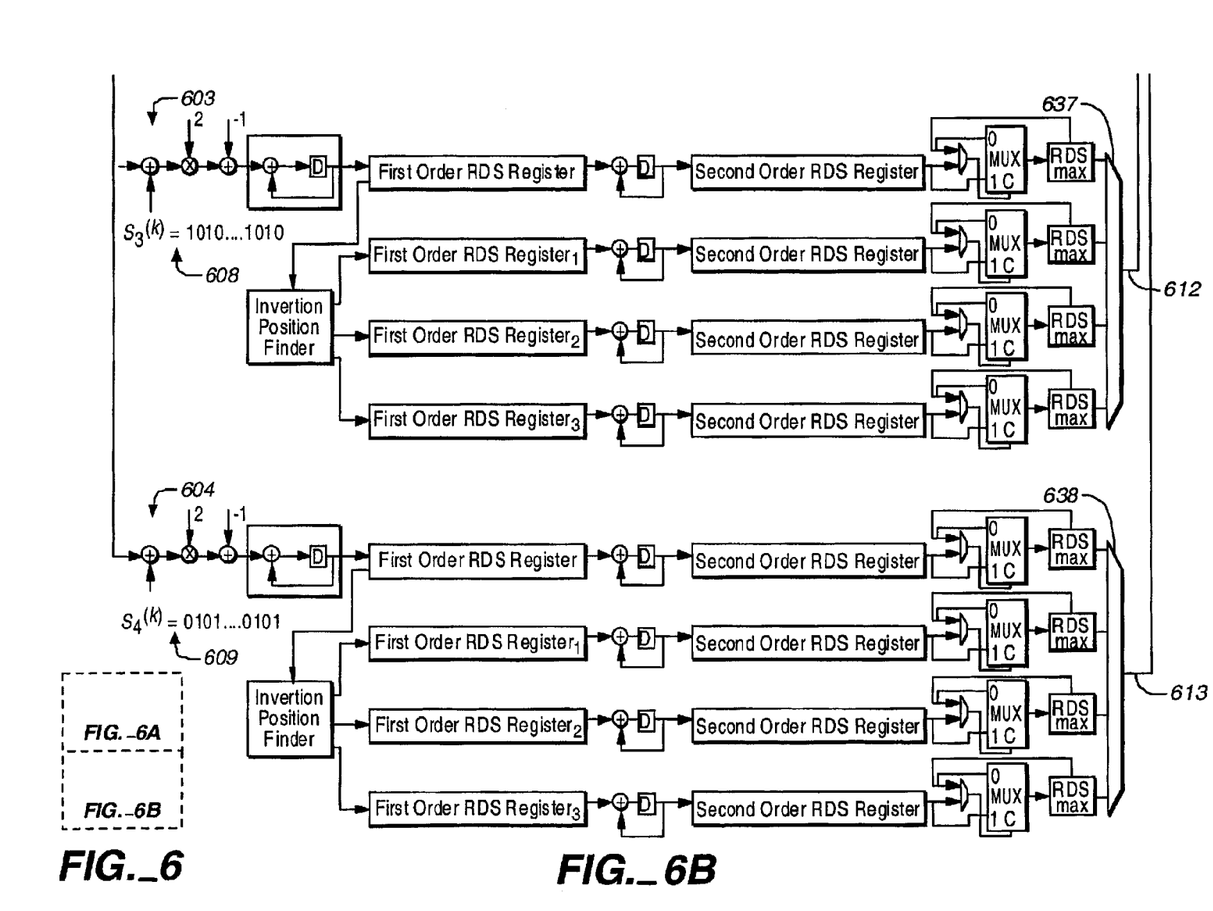
FIG. 6 is a block diagram illustrating an apparatus configured to implement encoding methods of the present invention.
Figure 6A:
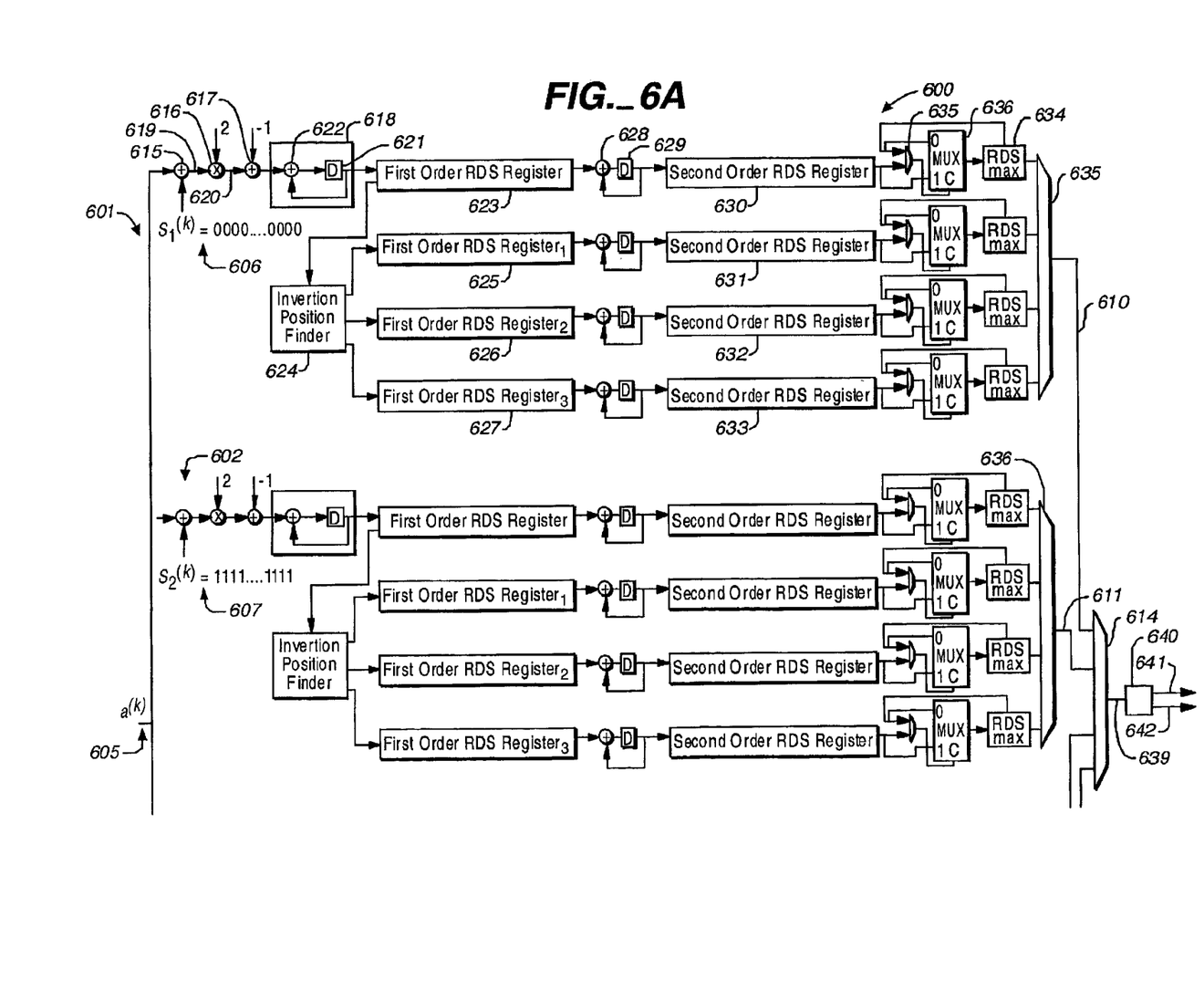

A detailed block diagram of the apparatus is shown in FIG. 6. In the embodiment illustrated in FIG. 6, the encoding circuit or apparatus is shown to include four identical parallel processing branches 601, 602, 603 and 604, each performing the operations on the same input uncoded sequence 605, and different scrambling sequences 606, 607, 608 and 609. The result of these operations are four integers 610, 611, 612 and 613, each corresponding to the second order digital sum in a particular branch. The running digital sums 610, 611, 612 and 613 are compared, using comparator 614, to select the branch with smallest second order digital sum. This is described below in greater detail.

Since all four of processing branches 601–604 are identical, a description of the operations performed in branch 601 is provided, and the description applies generally to the other branches as well. In the bit ex-or circuit 615 of processing branch 601, the scrambling sequence 606 is added modulo two to the sequence 605, one bit at a time to generate a sequence 619. In the processing circuits or blocks 616 and 617, which are respectively a multiplier and an adder, the binary sequence coming from processing branch 601 is translated to a bipolar sequence that is fed to processing circuit or block 618. The elements of a binary sequence take values from a set $\{0,1\}$, while the elements of a bipolar sequence take values from a set $\{-1,+1\}$. The multiplier 616 multiplies a bit of the sequence 619 out with two to generate an output 620. In adder 617, the value one is subtracted from a resulting number producing a bipolar sequence.

The block 618 is used to calculate the cumulative sum of a sequence at the output of adder 617. The cumulative sequence is the RDS as described above. The delayed value of the RDS at the output of a delay element 621 is added in the adder 622 to the bipolar sequence at the output of the adder 617. The values of running digital sum sequence (the values of running digital sum at each position within a block of length 256) are stored in register 623. The logic block 624 finds a position within the block from which the inversion of bits can start. This operation is done according to the algorithm discussed above in the Theoretical Basis of the Method section. A set of positions P is found such that by inverting all the bits at positions equal or larger than the position P, a balanced codeword is produced. The block 624 further dictates inverting positions and storing them into a series of registers 625, 626 and 627. It should be understood that the number of such registers is not limited to four, but can be any number L. If there are less positions P from which the inversion can start than there are registers, then the inversion position finder 624 fills all remaining registers 625, 626 and 627 with a sequence comprised of all +1s.

Following register 623 are an adder 628 and a delay element 629. The purpose adder 628 and delay element 629 is similar to the purpose of adder 622 and delay element 621 of block 618, which is to find the cumulative sum of a sequence brought to the input of the adder. The adder 628 sums values of running digital sum from register 623 and the delayed value of the second order digital sum at the output of a delay element 629. The result is a second order digital sum (2RDS). The values of 2RDS are stored in the shift register 630. The same set of operations is also performed on each stream of running digital sums at the outputs of registers 625, 626 and 627. Using these operations, the sequences of second-order running digital sums of length 256 are produced and stored in registers 631, 632 and 633. The values of second-order digital sum sequences are read one by one from the registers 630, 631, 632 and 633, and the maximum value within a block of 256 is found.

Finding the maximum second order digital sum is performed by identical sets of circuitry following registers 630, 631, 632 and 633. The operation will be explained by using the notation in the branch 601. The current maximal value of 2RDS is kept in the register 634. It is compared with the output of a register 630 using comparator 635, the output of which is fed to the control input of a binary multiplexer 636. The multiplexer 636 passes the larger 2RDS value to the register 634. By performing these operations on each of 256 2RDS values, the overall maximum value will be present in the register 634 at the end of the last comparison.

As explained above in the discussion of the theoretical basis of the algorithm, the stream with the smallest deviation of a 2RDS will have the most suppressed low frequency components. To find such a sequence from a set of 4 times L sequences, a series of comparisons are performed using comparators 635, 636, 637 and 638 (which provide respective integers 610, 611, 612 and 613, each corresponding to the second order digital sum in a particular branch) and comparator 614. The output 639 of comparator 614 is fed to a logic circuit 640, which is used to produce a sequence 641 with the smallest deviation of 2RDS. This logic circuit 640 also gives as an output 642 the 8-bit position from where the inversion has started, and the 2-bit information on which scrambling sequence is used. The 8-bit position information is then encoded in the 8–10 balanced block code and the appended to the coded sequence. The 2 bits specifying which scrambling sequence is used is also appended to the codeword. To perform the 8–10 encoding a look-up table can be used. The table is comprised of 252 balanced words of length 10 and 2 words of disparity 2 and 2 words of disparity −2.

Figure 7:
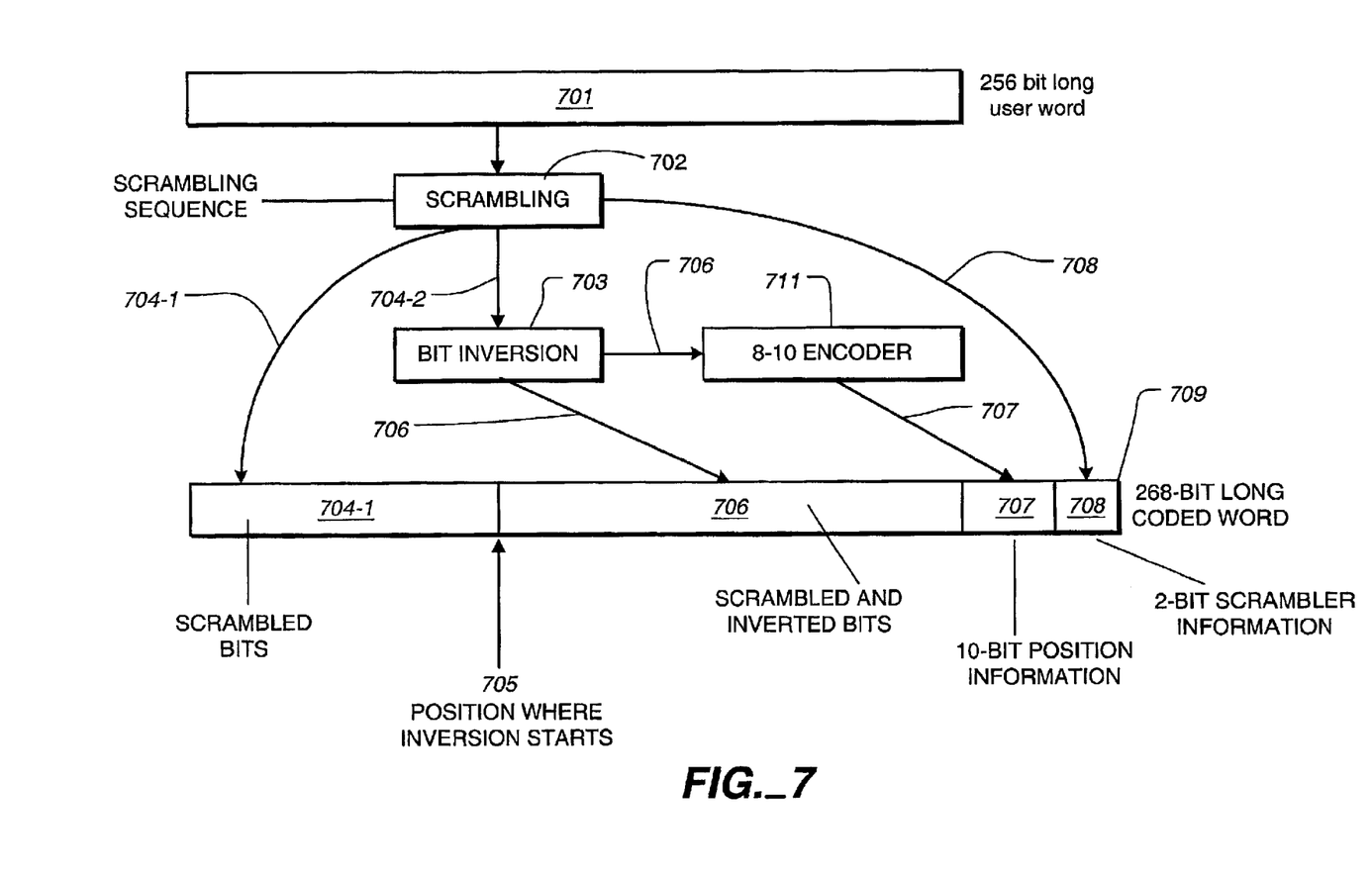
FIGS. 7 and 8 are diagrammatic illustrations of, respectively, encoding and decoding operations of the present invention.

The operations of the encoding method are summarized in FIG. 7. A 256-bit long data word 701 (for example sequence 605 shown in FIG. 6) is scrambled in the scrambler 702 by one of four scrambling sequences (for example, scrambling sequences 606, 607, 608 and 609 shown in FIG. 6) to generate scrambled portions 704 (scrambled bits which can be described as first and second scrambled portions 704-1 and 704-2). Scrambled portion 704-1 is a first portion of a coded word. Then, the second portion 704-2 is inverted in the bit inversion logic 703, starting from a position given by the position information 705 that is has been determined by the circuitry in FIG. 6. The scrambled portion of the stream 704-1, the scrambled and inverted portion of the stream 706, as well as the 10-bit information 707 on the position where inversion starts, and the 2-bit information 708 on the scrambling sequence used are combined to create a 268-bit codeword 709. The 10 bit sequence 707 carrying the information on the position where the inversion starts is obtained by encoding the sequence 706 at the output of bit inversion logic 703 using an 8–10 block encoder 711.

Figure 8:
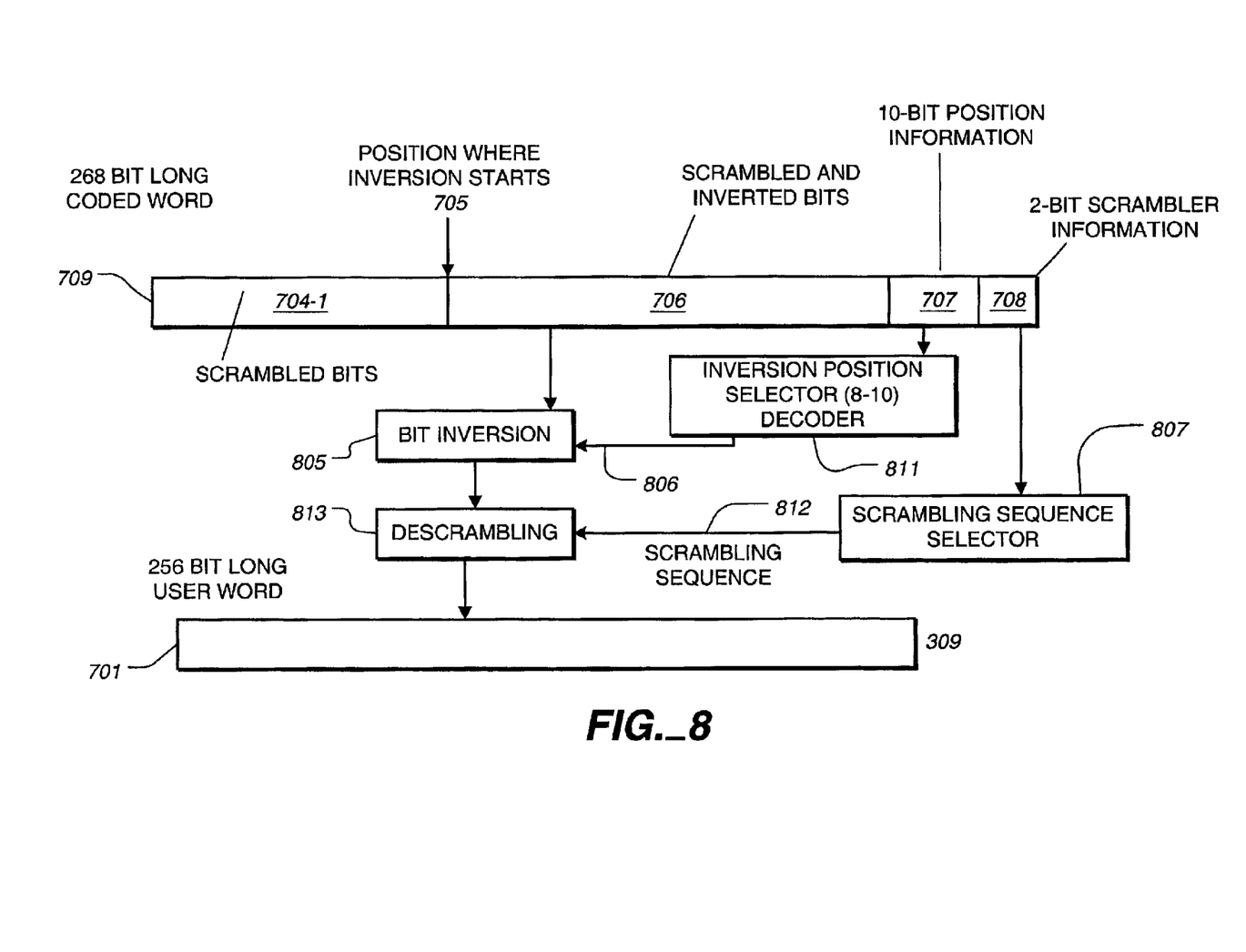

The decoding operation is explained in FIG. 8. The 10-bit portion 707 of the 268-bit code word 709 is decoded using decoder 811, and the 8-bit information 806 on the position from which to start inversion is determined. This information is used in bit inversion logic 805 to invert the portion of scrambled and inverted bits 706. The information 708 on the scrambling sequence is used by scrambling sequence selector 807 to select a scrambling sequence 812. By adding the scrambling sequence 812 which is identical to the scrambling sequence used in the encoder, descrambler 813 generates or recovers the original 256 bit long user word 701.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the encoding method and apparatus while maintaining substantially the same functionality without departing from the scope and spirit of the present invention. In addition, although the embodiments described herein are directed to an encoding method and apparatus for a disc drive data storage system, it will be appreciated by those skilled in the art that the teachings of the present invention can be applied to other systems, like magnetic tape data storage systems, without departing from the scope and spirit of the present invention.

What is claimed is:

1. A method of encoding digital information in order to suppress direct current (dc) content, the method comprising:
   receiving a sequence of m message bits of a message word;
   mapping the sequence of m message bits of the message word to a codeword, of length n bits, generated from the m message bits using algebraic operations, wherein mapping the sequence of m message bits further comprises:
      generating a plurality of codeword candidates, each of length n bits, from the m message bits using algebraic operations by adding a different one of a plurality of periodic scrambling sequences to the m message bits of the message word; and
      selecting one of the plurality of codeword candidates based upon an optimizing criteria.

2. The method of claim 1, wherein selecting one of the plurality of codeword candidates further comprises generating second order digital sum sequences corresponding to each of the plurality of codeword candidates, and selecting the one of the plurality of codeword candidates based upon the second order digital sum sequences.

3. The method of claim 2, wherein each of the plurality of codeword candidates is a binary sequence, and wherein selecting one of the plurality of codeword candidates further comprises converting the bipolar sequence of each codeword candidate to a bipolar sequence.

4. The method of claim 3, wherein for the bipolar sequence corresponding to each of the plurality of codeword candidates, selecting one of the plurality of codeword candidates further comprises:
   generating a first order running digital sum for the codeword candidate;
   determining a set of positions within the codeword candidate, such that, modifying the codeword candidate by inverting bits in the codeword candidate starting at a position from the set of positions results in a running digital sum for the codeword candidate being equal to zero; and
   calculating a separate second order running digital sum sequence for the codeword candidate and each respective position in the corresponding set of positions within the codeword candidate at which bit inversion began.

5. The method of claim 4, wherein calculating the separate second order running digital sum sequence for the codeword candidate and each respective position in the corresponding set of positions within the codeword candidate further comprises calculating the second order running digital sum sequences for each of the plurality of codeword candidates and for each respective position in the corresponding set of positions at which bit inversion began as cumulative sums of first order running digital sum values.

6. The method of claim 5, wherein selecting one of the plurality of codeword candidates further comprises selecting the one of the plurality of codeword candidates and the position in the corresponding set of positions which produces the smallest absolute value of second order running digital sum, together with the periodic scrambling sequence which was added to it.

7. The method of claim 6, and before receiving the sequence of m message bits of a message word, further comprising modulating the message word with an error correcting code to provide the sequence of m message bits.

8. The method of claim 6, and after mapping the sequence of m message bits of the message word to the codeword, further comprising modulating the codeword with an error correcting code.

9. An encoding apparatus which encodes digital information in order to suppress direct current (dc) content, the encoding apparatus comprising:
   an input receiving a sequence of m message bits of a message word;
   a plurality of parallel processing branches each generating a different codeword candidate from the m message bits using algebraic operations, wherein each of the plurality of parallel processing branches comprises scrambling circuitry which receives the m message bits and a scrambling sequence as inputs and provides as an output a codeword candidate, wherein the scrambling sequence used by each processing branch is different than the scrambling sequence used by all of the others of the plurality of parallel processing branches; and
   a selector for selecting one of a plurality of codeword candidates, each generated by a different one of the plurality of parallel processing branches, based upon an optimizing criteria.

10. The encoding apparatus of claim 9, wherein each of the plurality of parallel processing branches further comprises conversion circuitry coupled to the scrambling circuitry, the conversion circuitry converting the codeword candidate from a binary sequence to a bipolar sequence.

11. The encoding apparatus of claim 10, wherein each of the plurality of parallel processing branches further comprises:
   first order running digital sum calculating circuitry, coupled to the conversion circuitry to generate a first order running digital sum for the codeword candidate having the bipolar sequence;
   inversion position determining circuitry coupled to the first order running digital sum circuitry to determine a set of positions within the codeword candidate, such that, modifying the codeword candidate by inverting bits in the codeword candidate starting at a position from the set of positions results in a running digital sum for the codeword candidate being equal to zero; and
   a plurality of running digital sum registers storing a running digital sum sequence for the codeword candidate and each respective position in the corresponding set of positions within the codeword candidate at which bit inversion began.

12. The encoding apparatus of claim 11, wherein each of the plurality of parallel processing branches further comprises second order running digital sum calculating circuitry coupled to the plurality of running digital sum registers to calculate a separate second order running digital sum sequence for the codeword candidate and each respective position in the corresponding set of positions within the codeword candidate at which inversion begins.

13. The encoding apparatus of claim 12, wherein the selector is coupled to the plurality of parallel processing branches and selects the one of a plurality of codeword candidates and the position in the corresponding set of positions which produces the smallest absolute value of the second order running digital sum, together with the corresponding scrambling sequence.

14. An apparatus for encoding digital information in order to suppress direct current (dc) content, the apparatus comprising:
   an input which receives a sequence of m message bits of a message word; and
   means for mapping the sequence of m message bits of the message word to a codeword, the means for mapping comprising:
      a plurality of parallel processing branches each generating a different codeword candidate from the m message bits using algebraic operations, each of the plurality of parallel processing branches comprises scrambling circuitry which receives the m message bits and a scrambling sequence as inputs and provides as an output a codeword candidate, wherein the scrambling sequence used by each processing branch is different than the scrambling sequence used by all of the other of the plurality of parallel processing branches; and
      a selector for selecting one of a plurality of codeword candidates, each generated by a different one of the plurality of parallel processing branches, based upon an optimizing criteria.

15. The apparatus of claim 14, wherein each of the plurality of parallel processing branches further comprises conversion circuitry coupled to the scrambling circuitry, the conversion circuitry converting the codeword candidate from a binary sequence to a bipolar sequence.

16. The apparatus of claim 15, wherein each of the plurality of parallel processing branches further comprises:
   first order running digital sum calculating circuitry, coupled to the conversion circuitry to generate a first order running digital sum for the codeword candidate having the bipolar sequence;
   inversion position determining circuitry coupled to the first order running digital sum circuitry to determine a set of positions within the codeword candidate, such that, modifying the codeword candidate by inverting bits in the codeword candidate starting at a position from the set of positions results in a running digital sum for the codeword candidate being equal to zero; and
   a plurality of running digital sum registers storing a running digital sum sequence for the codeword candidate and each respective position in the corresponding set of positions within the codeword candidate at which bit inversion began.

* * * * *